(12) United States Patent
Choi (10) Patent No.: US 7,417,215 B2
(45) Date of Patent: Aug. 26, 2008

(54) FABRICATION METHOD AND TEST METHOD FOR LIGHT EMITTING DISPLAY

(75) Inventor: Woong Sik Choi, Gyeonggi-do (KR)

(73) Assignee: Samsung SDI Co., Ltd (KR)

( * ) Notice: Subject to any disclaimer, the term of this patent is extended or adjusted under 35 U.S.C. 154(b) by 23 days.

(21) Appl. No.: 11/432,181

(22) Filed: May 11, 2006

(65) Prior Publication Data
US 2006/0255244 A1 Nov. 16, 2006

(30) Foreign Application Priority Data
May 13, 2005 (KR) ............... 10-2005-0040310

(51) Int. Cl.
*G01J 1/42* (2006.01)
*G01J 1/32* (2006.01)
*H01L 29/08* (2006.01)
*G09G 3/36* (2006.01)
*G09G 3/30* (2006.01)

(52) U.S. Cl. ............ 250/208.2; 250/205; 257/40; 349/37; 345/76

(58) Field of Classification Search ......... 250/204, 250/205, 553, 208.2, 208.1, 370.09; 345/76, 345/77, 87, 89, 204, 205, 690; 349/41, 42, 349/43, 37, 96, 141, 149; 257/40, 59, 72, 257/88, 94, 146, 296, 338
See application file for complete search history.

(56) References Cited

U.S. PATENT DOCUMENTS 7,319,444 B2 * 1/2008 Jo .................... 345/76
2003/0214522 A1 * 11/2003 Kageyama et al. ........ 345/690

* cited by examiner

*Primary Examiner*—Georgia Y. Epps
*Assistant Examiner*—Don Williams
(74) *Attorney, Agent, or Firm*—Knobbe Martens Olson & Bear LLP

(57) ABSTRACT

A fabrication method and a test method for a light emitting display that together produce a pixel portion of the display by fabricating pixel circuits, testing the pixel circuits, and subsequently fabricating light emitting diodes is disclosed.

20 Claims, 8 Drawing Sheets

FABRICATION METHOD AND TEST METHOD FOR LIGHT EMITTING DISPLAY

CROSS-REFERENCE TO RELATED APPLICATIONS

This application claims the benefit of Korean Patent Application No. 2005-40310, filed on May 13, 2005, in the Korean Intellectual Property Office, the disclosure of which is incorporated herein by reference.

BACKGROUND OF THE INVENTION

1. Field of the Invention

The present invention relates to a fabrication method and a test method for a light emitting display, more specifically to a fabrication method for a light emitting display that fabricates a pixel portion simply and conveniently using the results of testing the pixel portion in the fabrication method.

2. Description of the Related Technology

A light emitting display may be an organic light emitting display using an organic light emitting diode or may be an inorganic light emitting display using an inorganic light emitting diode. The organic light emitting diode is named as an OLED, and includes an organic light emitting layer located between an anode electrode and a cathode electrode. Within the light emitting layer electrons and holes recombine and release light of a desired color. The inorganic light emitting diode is an LED, and includes an inorganic light emitting layer. As one example, a light emitting layer is made up of a PN-junction semi-conductor, as opposed to an inorganic light emitting diode.

Figure 1:
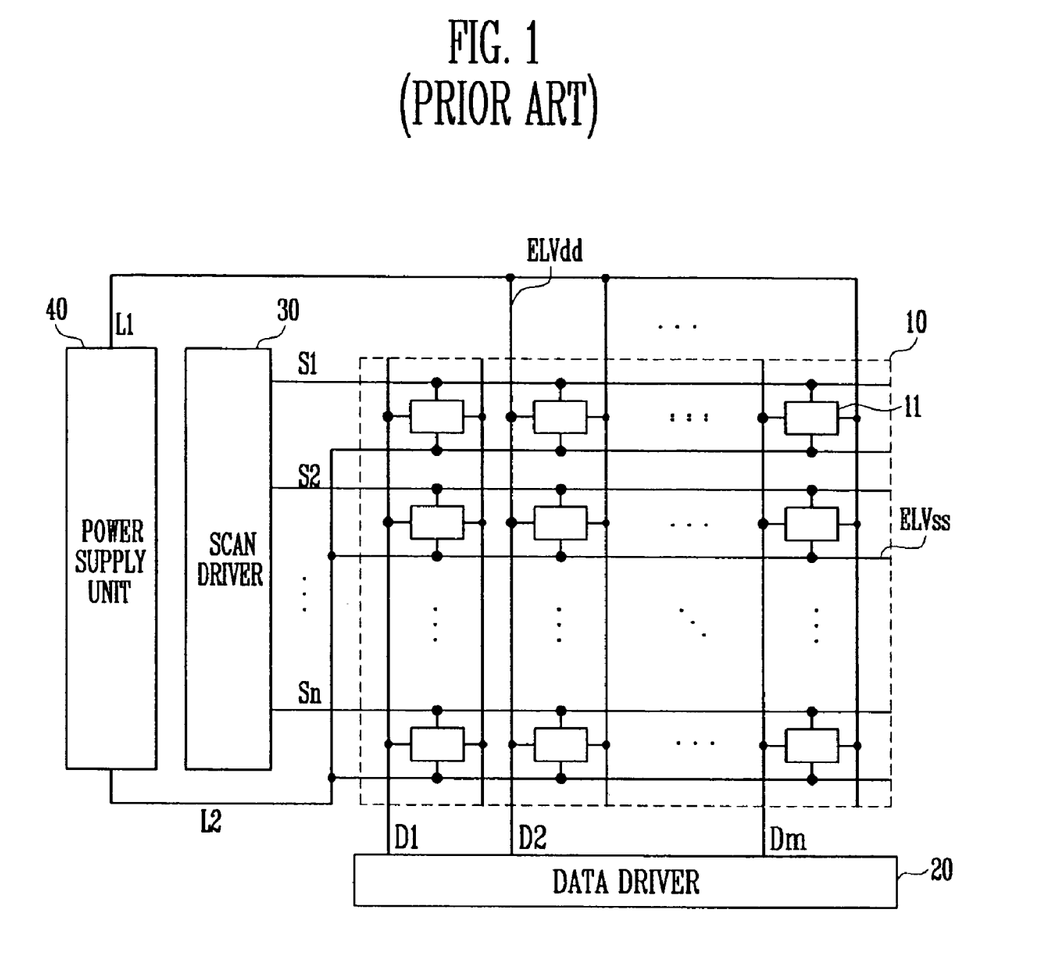
FIG. 1 is a schematic view which illustrates a structure of a light emitting display according to the conventional art.

FIG. 1 illustrates a structure of a light emitting display according to the conventional art. Referring to FIG. 1, the light emitting display comprises a pixel portion 10, a data driver 20, a scan driver 30 and a power supply unit.

The pixel portion 10 comprises a plurality of pixels 11, a plurality of scanning lines S, S2 ... Sn, a plurality of data lines D1, D2 ... Dm, a plurality of first power source lines ELVdd, and a plurality of second power source lines ELVss. The pixel 11 comprises a pixel circuit and a light emitting diode, wherein the pixel circuit is connected with a scanning line S, S2 ... Sn, a data line D1, D2 ... Dm and a first power source line ELVdd, receives a data signal and a first supply voltage, generates a current corresponding to the data signal and then transmits the data signal to a light emitting diode. The light emitting diode has a first electrode and a second electrode. When a current flows into the second electrode from the first electrode, the diode emits light in accordance with a brightness corresponding to the amount of current. The first electrode of the light emitting diode is connected with the pixel circuit and the second electrode of the light emitting diode is connected with the second power source line ELVss. Herein, the second power source line is expressed as a plurality of wires, but is represented equivalently.

A data driver 20 is connected with a plurality of data lines D1, D2 ... Dm, and transmits a data signal to the pixel portion 10.

The scan driver 30 is connected with a plurality of scanning lines S1, S2 ... Sn, and transmits a scanning signal to the pixel portion 10.

The power supply unit transmits the first supply voltage through a first wire L1, and transmits a second supply voltage through a second wire L2. The first wire L1 is connected with the first power source line ELVdd and transmits the first supply voltage each pixel 11 of the pixel portion 10 through the first power source line ELVdd, and the second L2 is connected with the second power source line ELVss and transmits the second supply voltage to each pixel 11 of the pixel portion 10 through the second power source line ELVss. Accordingly, the first supply voltage and the second supply voltage are respectively transmitted to each pixel 11 of the pixel portion 10 and thus the pixel portion 10 is driven.

The light emitting display in accordance with the conventional art comprises a plurality of pixels, which are connected with a plurality of wires on a substrate. TFT's are generally formed before forming the light emitting diodes of each pixel. Before forming the light emitting diodes, an electric state of the substrate is identified by transmitting an electrical signal through a wire and then sensing a corresponding output signal. If the electric state seems to be in order after the identifying process, the light emitting display is completed by forming the light emitting diodes.

However, a light emitting display in accordance with the conventional art cannot test individual pixels without forming the light emitting diodes. Particularly, there has been a problem that in order to enhance the picture quality of a light emitting display, a number of transistors are formed in each pixel, and a transmission path of a signal in accordance with a connection of each transistor is complicated and thus a test gets more difficult.

SUMMARY OF CERTAIN INVENTIVE ASPECTS

Accordingly, a fabrication method and a test method for a light emitting display that is able to test a light emitting display easily is presented.

One embodiment is a method of manufacturing a light emitting display. The method includes forming at least one pixel circuit, the pixel circuit including a thin film transistor, a capacitor connected to the thin film transistor, and a resistor connected to the thin film transistor. The method also includes forming a scanning line, a data line and a first power source line, where the scanning line, the data line, and the first power source line are each connected to the pixel circuit. The method also includes testing the pixel circuit by supplying a signal to the pixel circuit and measuring a response, forming an anode electrode for a light emitting diode, and removing the resistor, where forming the anode and removing the resistor are results of one or more common manufacturing steps.

Another embodiment is a method of manufacturing a pixel for a light emitting display, the method including forming a pixel circuit configured to provide a current to an output, where the amount of current corresponds to a pixel circuit input signal, forming a resistor connected to the output and to a signal line, determining the operational condition of the pixel circuit, and forming a light emitting diode so as to be connected to the pixel circuit output, where the resistor is removed.

BRIEF DESCRIPTION OF THE DRAWINGS

These and/or other aspects and advantages will become apparent and more readily appreciated from the following description, taken in conjunction with the accompanying drawings of which:

FIGS. 5a through 5c are layout views which illustrate a fabrication process of the pixel portion depicted in FIG. 2.

DETAILED DESCRIPTION OF PREFERRED EMBODIMENTS

The following Examples are given for the purpose of illustration only and are not intended to limit the scope of this invention.

Hereinafter, embodiments will be described with reference to the accompanying drawings. Herein, when a first element is connected to a second element, the first element may be directly connected to the second element or may be indirectly connected to the second element via a third element. Further, irrelative elements are omitted for clarity. Also, like reference numerals refer to like elements throughout.

Figure 2:
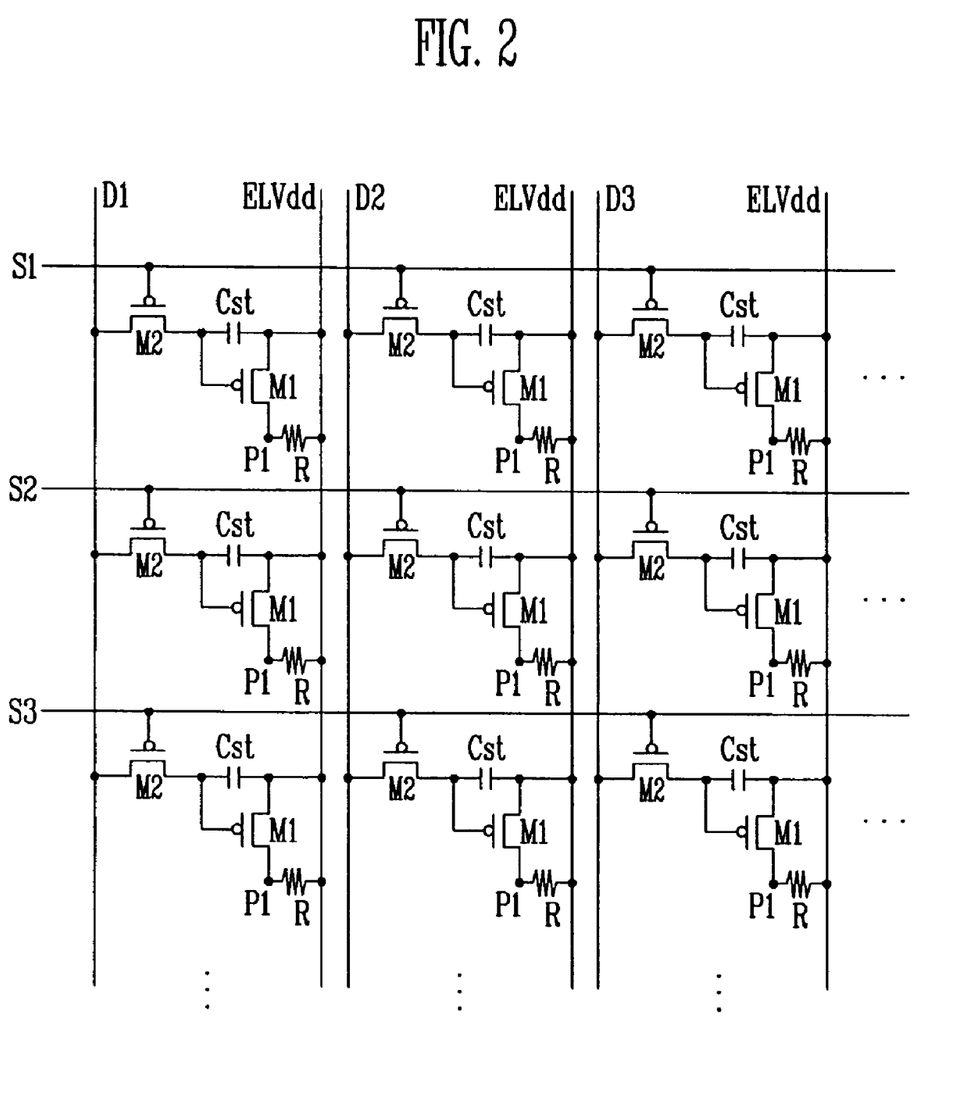
FIG. 2 is a schematic view which illustrates an embodiment of a pixel portion in a state of not having the light emitting diodes formed.

FIG. 2 illustrates a first exemplary embodiment of a pixel portion having a state that the light emitting diodes are not yet formed. As shown in FIG. 2, parts of a pixel are seen and a pixel circuit of 3×3 size is shown. Referring to FIG. 2, a plurality of scanning lines S1, S2, S3 are arranged in a row direction, and a plurality of data lines D1, D2, D3 and a plurality of first power source lines ELVdd are arranged in a column direction. Furthermore, the scanning lines S1, S2, S3, the data lines D1, D2, D3, and the first power source lines ELVdd are each connected with a pixel circuit.

Each pixel circuit has a first transistor M1, a second transistor M2 and a capacitor Cst, where the first transistor M1 and the second transistor M2 are PMOS transistors and have a source, a drain and a gate. The source and the drain of each transistor are electrically substantially identical, and any one of the source and the drain can be named as a first electrode and the other can be named as a second electrode. In addition, the capacitor Cst has a first terminal and a second terminal. For the simplified explanation, a first pixel circuit through a ninth pixel circuit is respectively named from left and to right and from up and to down. A structure of the pixel circuit will be explained using the first pixel circuit as follows.

A source of the first transistor M1 is connected with the first power source line ELVdd, a drain of the first transistor M1 is connected with the first contact point P1. The first contact point P1 is connected with the first power source line ELVdd through a resistor, polyresistance R. A gate of the first transistor M1 is connected with a drain of the second transistor M2, so that a current corresponding to a voltage supplied to the gate of the first transistor M1 flows from the source and to the drain. Accordingly, the source and the drain of the first transistor M1 received the first supply voltage from the first power source ELVdd.

A source of the second transistor M2 is connected with a data line D1. A drain of the second transistor M2 is connected with a gate of the first transistor M1. A gate of the second transistor M2 is connected to a scanning line S1, and performs a switching operation corresponding to a scanning signal, and thus a data signal is transmitted to the gate of the first transistor M1.

A first terminal of the capacitor Cst is connected with the first power source line ELVdd, a second terminal of the capacitor Cst is connected with the gate of the first transistor M1 A voltage corresponding to the difference between a voltage of the first power source line ELVdd transmitted through the first power source line ELVdd and a voltage of a data signal is stored during a pre-charge time. Accordingly, even though the second transistor M2 cuts off the data signal through a switching operation, the data signal is maintained at the gate of the first transistor M1 by the capacitor Cst. Thus, a current corresponding to the data signal can flows from the source of the first transistor M1 to the drain of the first transistor M1.

Figure 3:
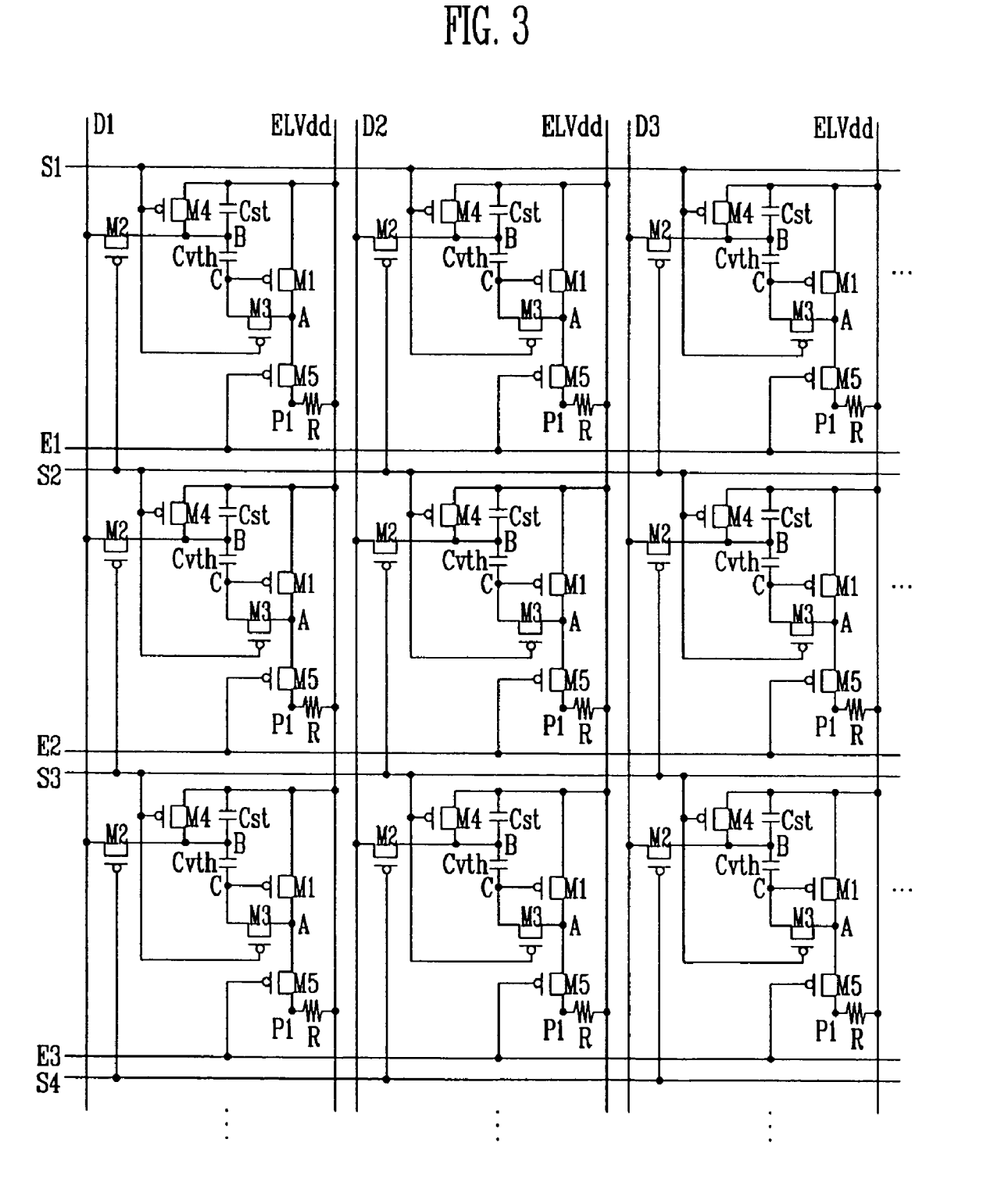
FIG. 3 is a schematic view which illustrates another embodiment of a pixel portion in a state of not having the light emitting diodes formed.

FIG. 3 illustrates another embodiment of a pixel portion in a state such that the light emitting diodes are not yet formed. As shown in FIG. 3, parts of the pixel are shown and a pixel circuit of 3×3 size is shown. Referring to FIG. 3, a plurality of scanning lines S1, S2, S3, S4 are arranged in a row direction, and a plurality of data lines D1, D2, D3 and a plurality of first power source lines ELVdd are arranged in a column direction. The scanning lines S1, S2, S3, S4, the data lines D1, D2, D3, and the first power source lines ELVdd are each connected with the pixel circuits. For simplified explanation, a first pixel circuit through a ninth pixel circuit is respectively named from left and to right and from up and to down. A structure of the pixel circuit will be explained using t he first pixel circuit as follows.

Each pixel circuit has an identical structure, and has a first transistor M1 through a fifth transistor M5 and a first capacitor Cst and a second capacitor Cvth. The first transistor M1 through the fifth transistor M5 are embodied as a PMOS transistors and each have a source, a drain and a gate. The source and the drain of each transistor are electrically substantially identical, and any one of the source and the drain can be named as a first electrode and the other can be named as a second electrode. In addition, the first capacitor Cst and the second capacitor Cvth each have a first terminal and a second terminal.

For the simplified explanation, a structure of the pixel circuit will be explained using the first pixel circuit as follows. A source of the first transistor M1 is connected with the first power source line ELVdd. A drain of the first transistor M1 is connected with a first node A. A gate of the first transistor M1 is connected with a third node C. Accordingly, a current corresponding to a voltage supplied to the third node C flows from the source and to the drain of the first transistor M1.

The source of the second transistor M2 is connected with the data line D1, the drain of the second transistor M2 is connected with a second node B, and a gate of the second transistor M2 is connected with a second scanning line S2. A data signal is selectively supplied to the second node B according to the second scanning signal supplied through the second scanning line S2.

A source of a third transistor M3 is connected with the first node A, a drain of the third transistor M3 is connected with the third node C, a gate of third transistor M3 is connected with the first scanning line S1, and thus the first transistor M1 selectively becomes a diode connection by the first scanning signal supplied through the first scanning line S1.

A source of a fourth transistor M4 is connected with the first power source line ELVdd, a drain of the fourth transistor M4 is connected with the second node B, and a gate of fourth transistor M4 is connected with the first scanning line S1. Thus, a voltage of the first power source line ELVdd is transmitted to the second node B according to the first scanning signal supplied through the first scanning line S1.

A source of a fifth transistor M5 is transmitted to the first node A, a drain of the fifth transistor M5 is connected with the first contact point P1. A gate of fifth transistor M5 is connected with a light emission control line E1. Thus, a current which flows from the source of the first transistor M1 to the drain of the first transistor M1, can be selectively transmitted to the first contact point P1 by a light emission control signal which is selectively supplied through the light emission control line En. The first contact point P1 is connected with the power source line ELVdd through the polyresistance R. Accordingly, if the fifth transistor M5 is turned on, the drain of the first transistor M1 receives the first supply voltage from the first power source line ELVdd, and thus the source and the drain of the first transistor M receive the first supply voltage.

The first electrode of the first capacitor Cst is connected with the first power source line ELVdd. The second electrode of the first capacitor Cst is connected with the second node B, and thus, if a data signal is transmitted to the second node B, the first capacitor Cst stores a voltage according to the difference between the data signal and the first power source line ELVdd.

The first electrode of the second capacitor Cvth is connected with the second node B. The second electrode of the capacitor Cst is connected with the third node C. Thus, if the first transistor M1 is diode connected by the third transistor M3, the second capacitor Cvth stores a threshold voltage of the first transistor M1.

Figure 4:
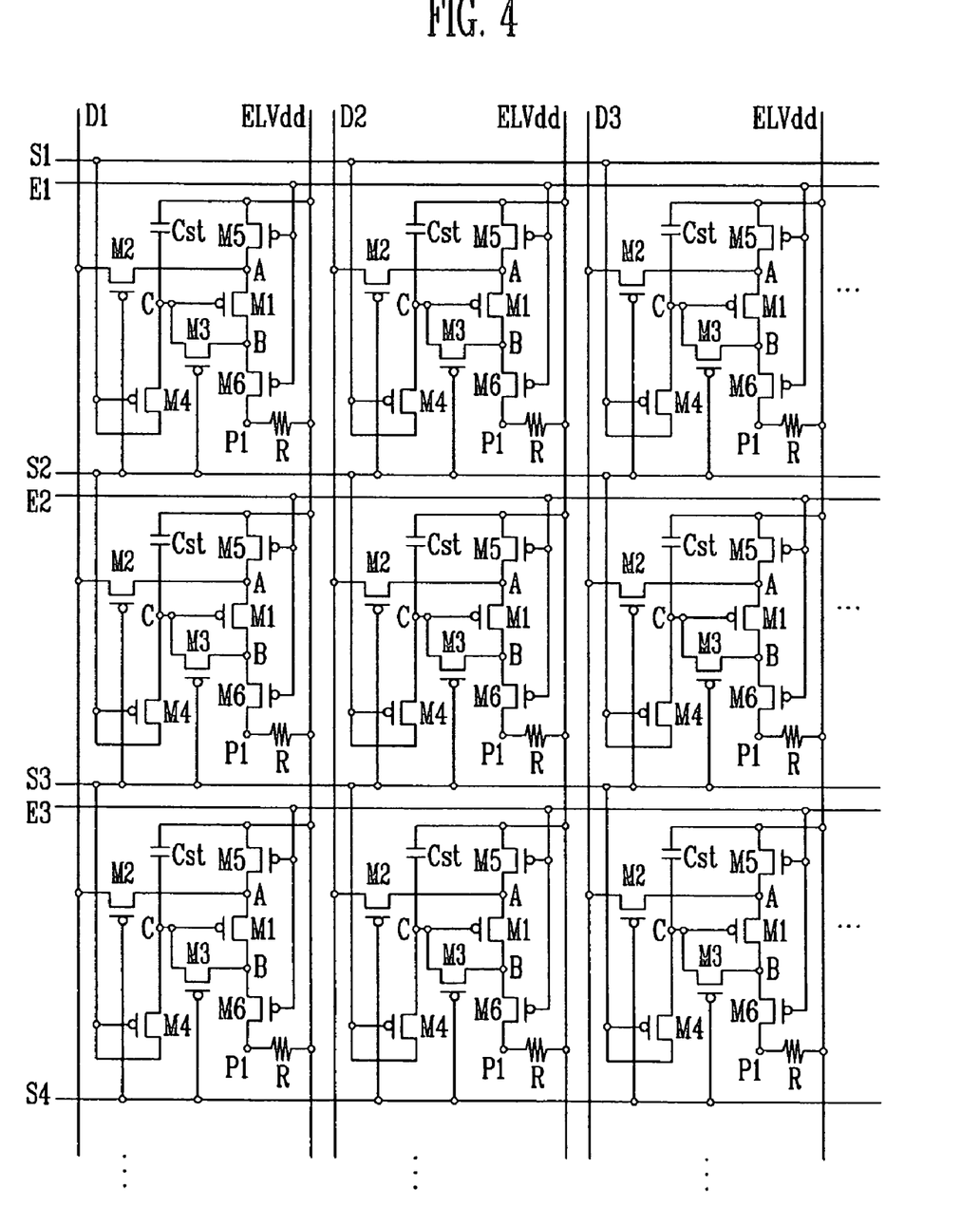
FIG. 4 is a schematic view which illustrates another embodiment of a pixel portion in a state of not having the light emitting diodes formed.

FIG. 4 illustrates another embodiment of a pixel portion in a state such that the light emitting diodes are not yet formed. Referring to FIG. 4, a plurality of scanning lines S1, S2, S3, S4 are arranged in a row direction, and a plurality of data lines D1, D2, D3 and a plurality of first power source lines ELVdd are arranged in a column direction. And, the scanning lines S1, S2, S3, S4, the data lines D1, D2, D3, and first power source lines ELVdd are each connected with pixel circuits.

Each pixel circuit has an identical structure, and has a first transistor M1 through a sixth transistor M6 and a capacitor Cst.

The first transistor M1 through the sixth transistor M6 are embodied as a PMOS transistor and have a source, a drain and a gate. The source and the drain of each transistor are electrically substantially identical, and any one of the source and the drain can be named as a first electrode and the other can be named as a second electrode. In addition, the first capacitor Cst has a first terminal and a second terminal. For the simplified explanation, a first pixel circuit through a ninth pixel circuit is respectively named from left and to right and from up and to down. A structure of the pixel circuit will be explained using the first pixel circuit as follows.

A source of the first transistor M1 is connected with the first node A, a drain of the first transistor M1 is connected with a second node B, and a gate of the first transistor M1 is connected with a third node C. Accordingly, a current flows from the source and to the drain by a voltage supplied to the third node C.

The source of the second transistor M2 is connected with the data line D1, the drain of the second transistor M2 is connected with a first node A, and a gate of the second transistor M2 is connected with the second scanning line S2. Thus, a data signal is selectively supplied to the first node A according to the second scanning signal supplied through the second scanning line S2.

A source of a third transistor M3 is connected with the second node B, a drain of the third transistor M3 is connected with the third node C, and a gate of third transistor M3 is connected with the first scanning line S1. Thus, the first transistor M1 is selectively diode-connected according to the first scanning signal supplied through the first scanning line S1.

A source of a fourth transistor M4 is connected with the first scanning line S1, a drain of the fourth transistor M4 is connected with the third node C, and a gate of fourth transistor M4 is connected with the first scanning line S1. Thus, a signal corresponding to the first scanning signal supplied through the first scanning line S1 selectively initializes the capacitor Cst.

A source of a fifth transistor M5 is transmitted to the first power source line EVLdd, a drain of the fifth transistor M5 is connected with the first node A, and a gate of fifth transistor M5 is connected with a light emission control line En. Thus, a voltage, supplied from the first power source line ELVdd, is switched according to a light emission control signal selectively supplied through the light emission control line En.

A source of a sixth transistor M6 is connected to the second node B, a drain of the sixth transistor M6 is connected with the first contact point P1, and a gate of sixth transistor M6 is connected with a light emitting control line En. Thus, a current from the first transistor M1 is transmitted to the first contact point P1 according to a light emission control signal selectively supplied through the light emission control line En.

The first contact point P1 is connected with the first power source line ELVdd through the polyresistance R. In addition, the fifth transistor M5 and the sixth transistor M6 are turned on by an identical signal, and if the fifth transistor M5 and the sixth transistor M6 are turned on, the source and the drain of the first transistor M1 receive the first supply voltage through the first power source line ELVdd.

The first electrode of the capacitor Cst is connected with the first power source line ELVdd, and the second electrode of the capacitor Cst is connected with the third node C. Thus, if a data signal is transmitted to the third node C, the first capacitor Cst stores a voltage according to the data signal and the first power source line ELVdd.

Figure 5A:
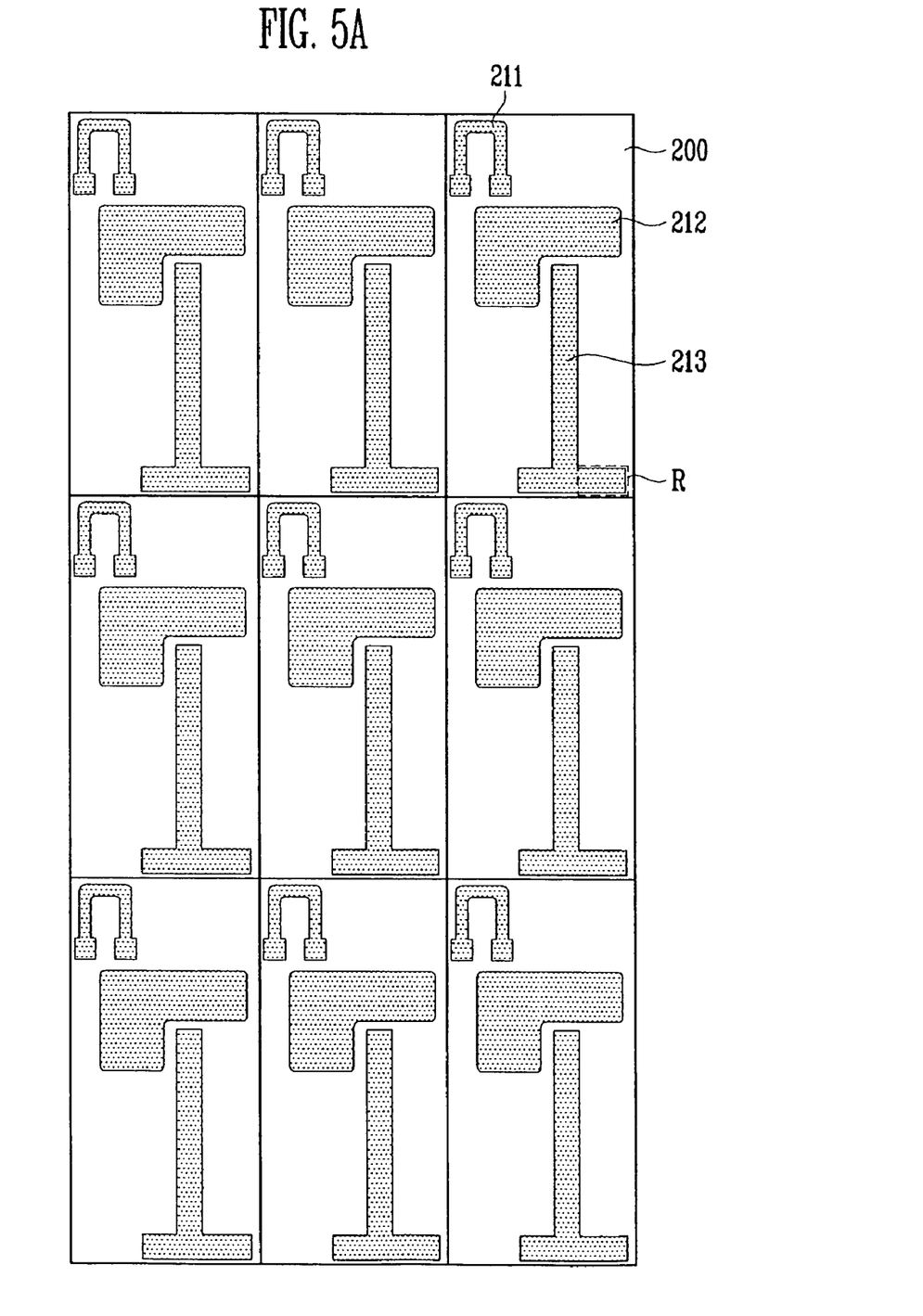
Figure 5B:
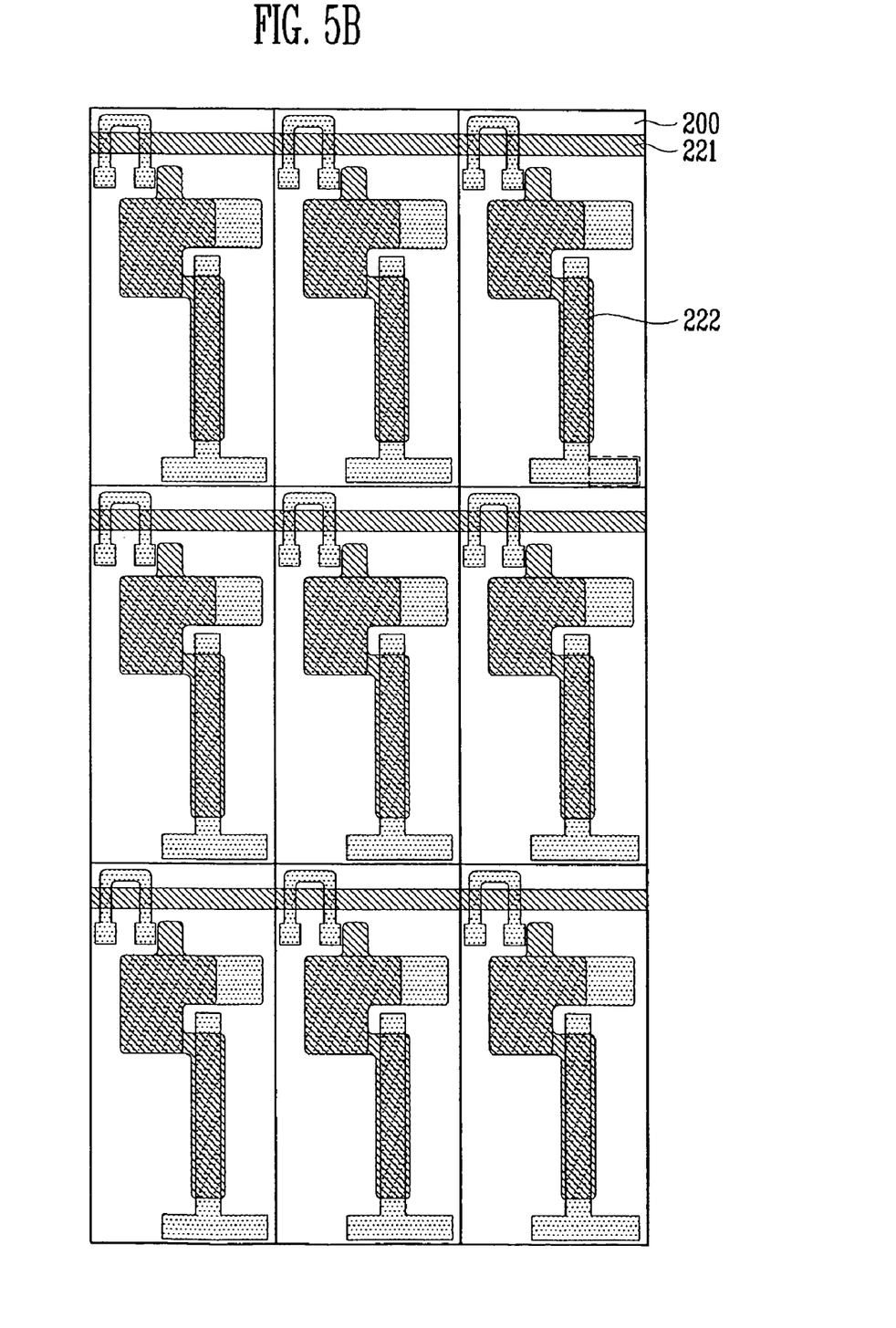
Figure 5C:
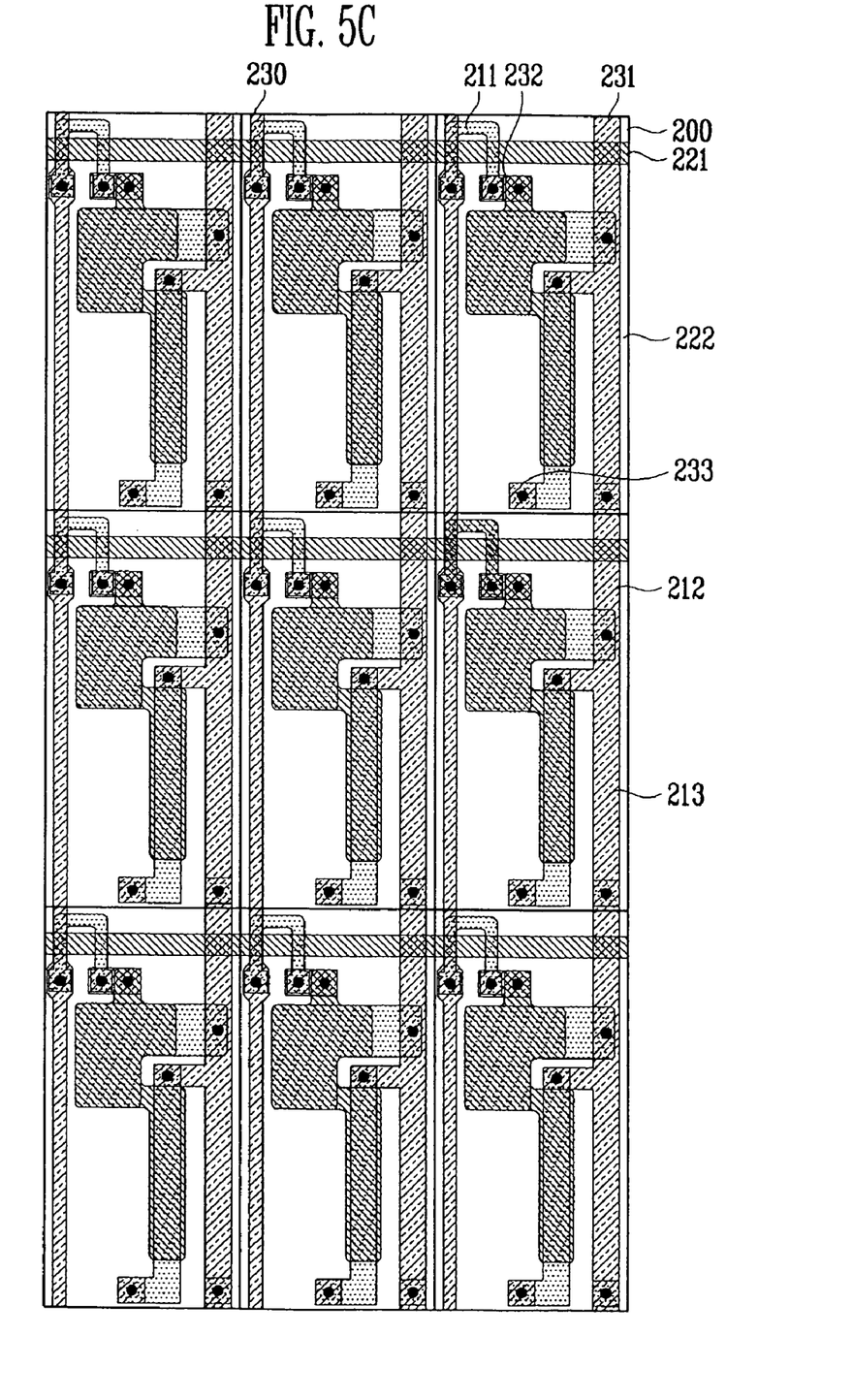

FIGS. 5a through 5c illustrate a fabrication process of a pixel portion depicted in FIG. 2. For simplified explanation, a fabrication process is limited to a pixel portion of FIG. 2 but may be applied to a pixel portion of FIGS. 3 and 4, as well as other pixels not described herein.

Referring to FIGS. 5a though 5c, a buffer layer is formed on a transparent substrate 200, and a polysilicon layer is evaporated and patterned onto the substrate 200. Thus, a polysilicon layer is formed as shown in FIG. 5.

The polysilicon layer comprises a channel 213 of a first transistor, a channel 211 of a second transistor, a first terminal 212 of a capacitor, and a polyresistance R. After a first insulating film is evaporated onto the substrate 200, a first metal layer is evaporated onto the substrate and subsequently patterned. A gate electrode is generated as shown in FIG. 5b. The gate electrode becomes a gate and a scanning line 211 of a first transistor, and a gate of a second transistor and a second terminal 222 of a capacitor.

After a second insulating film is evaporated onto the substrate, a second metal layer is evaporated onto the substrate and subsequently patterned. A first power source line 231, a source and a drain metal 232 of the first transistor, and a source and a drain metal 233 of the second transistor are generated as shown in FIG. 5c. The source and the drain metal are connected with a channel area of the first transistor and the second transistor through a contact hole. In addition, the first power source line is electrically connected with the polyresistance through a contact hole.

Figure 6:
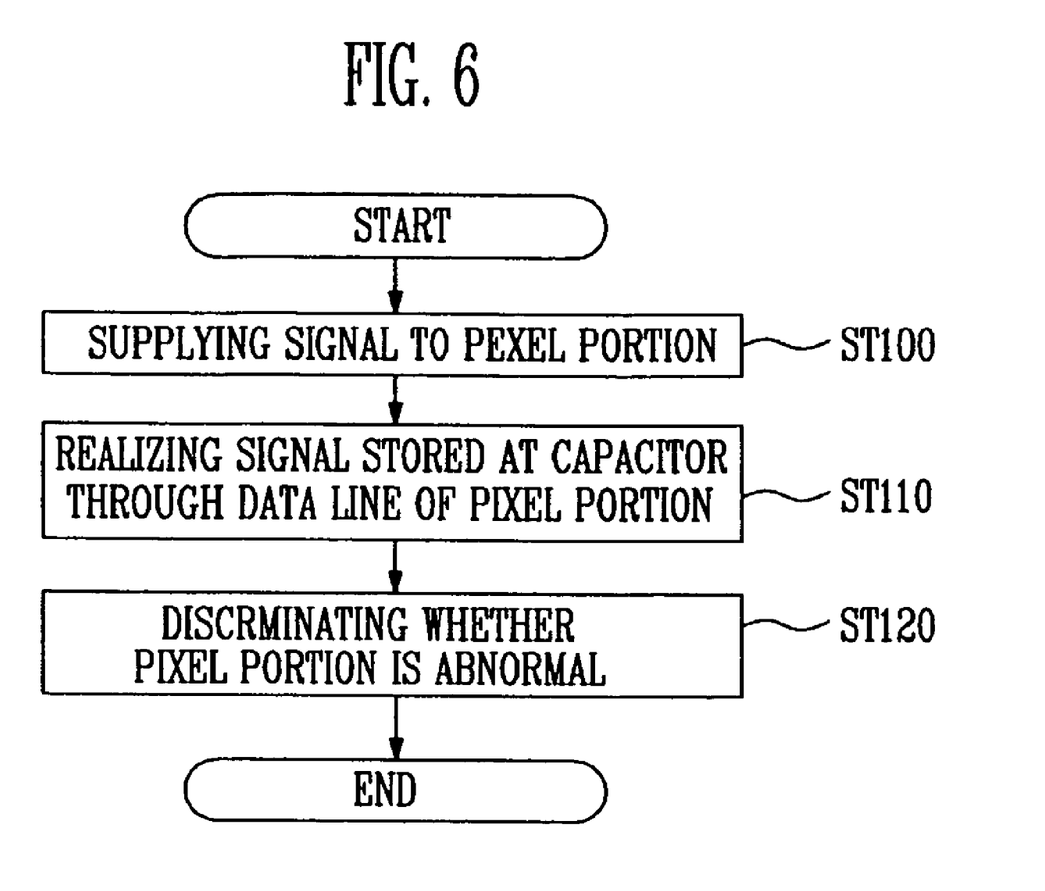
FIG. 6 is a flowchart which illustrates a testing process of the pixel portion depicted in FIG. 5.

FIG. 6 illustrates a process of testing the pixel portion depicted in FIG. 5.

At a first step ST 100, signals are supplied through a first power source line of a pixel portion, through a data line and through a scanning line. Accordingly, a predetermined voltage is stored across a capacitor Cst. A voltage corresponding to the signal supplied to the capacitor Cst through the data line is stored in a functioning pixel. However, a non-functioning pixel does not store the voltage at the capacitor Cst.

Some failure mechanisms for a non-functioning pixel are: an abnormal capacitor, an abnormal first transistor and an abnormal second transistor. If the capacitor Cst is opened, or not connected to, for example the drain of the second transistor M2, a voltage is not stored. Similarly, if the capacitor Cst is shorted, a voltage will not be stored. If the first transistor M is abnormal, or non-functional, for example, if a source and a gate of the first transistor M1 are shorted, a source voltage of the first transistor M1 becomes identical to a gate voltage of the first transistor M1 and a voltage is not stored at the capacitor Cst. In addition, if a drain and a gate of the first transistor M1 are shorted, a drain of the first transistor M is connected with the first power source line ELVdd through the polyresistance and thus, a gate voltage of the first transistor M1 becomes identical to a source of the first transistor M1. Accordingly, a voltage is not charged at the capacitor Cst. If the second transistor M is non-functional, a signal transmitted to the capacitor through a data line by the second transistor M2 is not passed to the capacitor Cst.

At second step ST 110 the capacitor Cst voltage is measured. While maintaining signals in the first power source line of the pixel portion 100 and in a scanning line, a voltage charged at the capacitor Cst is measured through a data line.

At third step ST 120 an operational condition, such as functionality of the pixel is determined. A normal, or functional, pixel outputs a voltage corresponding to a signal transmitted to the capacitor Cst through the data line. But a non-functional pixel does not charge a voltage at the capacitor Cst, or charges a voltage different from the voltage transmitted to the capacitor Cst and thus outputs a different voltage than that which is expected. Accordingly, if a certain signal is supplied, and a voltage read from a data line is not substantially identical to the expected voltage, a pixel is determined to be non-functional. Likewise, if the read voltage is substantially identical as the expected voltage, a pixel portion is determined to be functional.

After a pixel is determined to be functional, an LED anode electrode can be formed. In the process of forming the anode electrode, the polyresistance R can be eliminated.

An eliminating process of the polyresistance will be explained. Referring to FIG. 5C, an insulating film is formed over data line 230, the first power source ling 231, the source and the drain metal 232 of the first transistor, the source and a drain metal 233 of the second transistor, and the polyresistance. After the insulating film between the channel of the first transistor M1 and the power source line ELVdd is etched, a metal film is formed. The metal film is etched and patterned, and the remaining metal film becomes an anode electrode for the LED. In the process of patterning the anode electrode, if the metal film other than the anode electrode is etched, the polyresistance is etched. Thus, the desired result of creating the anode electrode and opening the connection between the drain of the first transistor M1 and the first power source line ELVdd is attained in substantially the same processing operation.

Although a few embodiments have been shown and described, it would be appreciated by those skilled in the art that changes might be made in this embodiment without departing from the principles and spirit of the invention.

According to a fabrication method and a test method for a light emitting display, whether an non-functional pixel is formed is easily determined by testing functionality of pixels of a light emitting display before forming corresponding light emitting diodes.

What is claimed is:

1. A method of manufacturing a light emitting display, the method comprising:
    forming at least one pixel circuit, the pixel circuit comprising:
        a thin film transistor;
        a capacitor connected to the thin film transistor; and
        a resistor connected to the thin film transistor;
    forming a scanning line, a data line and a first power source line, wherein the scanning line, the data line, and the first power source line are each connected to the pixel circuit;
    testing the pixel circuit by supplying a signal to the pixel circuit and measuring a response; and
    after testing the pixel circuit, forming an anode electrode for a light emitting diode, and removing the resistor, wherein the formation of the anode electrode and the removal of the resistor are results of one or more of the same manufacturing steps.

2. The method as in claim 1, wherein testing further comprises:
    supplying a signal to the scanning line, the data line and the first power source line so as to attempt to store a test voltage in the pixel circuit; and
    sensing a pixel circuit output so as to determine whether the test voltage was stored in the pixel circuit.

3. The method as in claim 2, wherein sensing the pixel circuit output comprises sensing the pixel circuit output on the data line or on the first power source line.

4. The method as in claim 1, wherein the resistor is formed as polysilicon, and is formed simultaneously with a channel area of the thin film transistor.

5. The method as in claim 1, wherein the pixel circuit further comprises:
    a first transistor configured to receive a data signal and then generate a current corresponding to the data signal;
    a second transistor configured to transfer the data signal to a gate of the first transistor; and
    a capacitor configured to store a voltage corresponding to the data signal and to substantially maintain a gate voltage of the first transistor.

6. The method as in claim 1, wherein the pixel circuit further comprises:
    a first transistor configured to receive a data signal and then generate a current corresponding to the data signal;
    a second transistor configured to transfer the data signal to a gate of the first transistor; and
    a first capacitor configured to store a voltage corresponding to the data signal;
    a second capacitor configured to store a voltage corresponding to a threshold voltage of the first transistor;
    a fourth transistor configured to selectively transfer a voltage of the first power source to the second capacitor;
    a fifth transistor configured to receive an emission control signal and to feed the current to a resistor or the light emitting diode.

7. The method as in claim 1, wherein the pixel circuit further comprises:
    a first transistor;
    a second transistor configured to selectively transfer a data signal to a gate of the first transistor;
    a third transistor configured to selectively diode-connect the first transistor;
    a fourth transistor configured to transfer an initialization signal to the first transistor;
    a fifth transistor configured to selectively connect the first transistor with the first power source;

a sixth transistor configured to selectively connect a voltage of the first power source to the first transistor;

a capacitor configured to store the initialization signal and to substantially maintain a voltage corresponding to the data signal at the gate of the first transistor.

8. A test method for a light emitting display, the method comprising: connecting a first power source line to a plurality of pixel circuits, each pixel circuit comprising: a location designated for a light emitting diode, wherein the location contains a resistor; providing one or more driving signals to one or more resistors of the plurality of pixel circuits; and sensing a plurality of pixel signals generated in the plurality of pixel circuits in response to the one or more driving signals, wherein the resistor of each pixel circuit is configured to be removed after the pixel signals are sensed.

9. The method as in claim 8, wherein the driving signal is carried by any one of a data line, a scanning line and a pixel power source line.

10. The method as in claim 8, wherein the plurality of pixel signals is carried by a plurality of data lines, and each of the pixel circuits are determined to be functional or non-functional based at least in part on the pixel signals.

11. The method as in claim 8, wherein the plurality of pixel signals is carried by a first power source line, and each of the pixel circuits are determined to be functional or non-functional based at least in part on the pixel signals.

12. The method as in claim 11, wherein the data line is connected with a test module configured to sense at least one of the pixel signals.

13. A method of manufacturing a pixel for a light emitting display, the method comprising:

forming a pixel circuit configured to provide a current to an output, wherein the amount of current corresponds to a pixel circuit input signal;

forming a resistor connected to the output and to a signal line;

determining the operational condition of the pixel circuit; and after determining the operational condition of the pixel circuit, forming a light emitting diode so as to be connected to the pixel circuit output, wherein the resistor is removed.

14. The method as in claim 13, wherein forming the pixel circuit comprises forming at least one thin film transistor and connecting the thin film transistor to at least one of a scanning line, a data line, and a power source line.

15. The method as in claim 13, wherein forming the resistor comprises forming a polysilicon resistor.

16. The method as in claim 13, wherein determining the operational condition comprises:

providing the pixel circuit with a first input signal configured such that a normal pixel circuit would store a first voltage, the first voltage corresponding to the input signal;

providing the pixel circuit with a second input signal configured such that a normal pixel circuit would output a second voltage, the second voltage corresponding to the first voltage; and comparing the second voltage to an expected value.

17. The method as in claim 16, the second input signal and the second voltage are carried by the same signal line.

18. The method as in claim 17, wherein the signal line is one of a data line, a scanning line, and a power source line.

19. The method as in claim 13, wherein the resistor is removed when a terminal of the light emitting diode is formed.

20. The method as in claim 13, wherein the resistor is removed when the anode of the light emitting diode is formed.

* * * * *